(12) United States Patent
Sasaki (10) Patent No.: US 10,534,278 B2
(45) Date of Patent: Jan. 14, 2020

(54) EXPOSURE APPARATUS AND METHOD OF MANUFACTURING ARTICLE

(71) Applicant: CANON KABUSHIKI KAISHA, Tokyo (JP)

(72) Inventor: Ryo Sasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/805,167

(22) Filed: Nov. 7, 2017

(65) Prior Publication Data

US 2018/0143543 A1    May 24, 2018

(30) Foreign Application Priority Data

Nov. 18, 2016  (JP) ................................. 2016-225374

(51) Int. Cl.
*G03B 27/52* (2006.01)
*G03F 7/20* (2006.01)

(52) U.S. Cl.
CPC ...... *G03F 7/70858* (2013.01); *G03F 7/70341* (2013.01)

(58) Field of Classification Search
CPC ............. G03F 7/70341; G03F 7/70133; G03F 7/70558
USPC ....................................................... 355/30, 53
See application file for complete search history.

(56) References Cited

U.S. PATENT DOCUMENTS

| 6,731,371 B1* | 5/2004 | Shiraishi | G03B 27/52 |
| | | | 250/492.2 |
| 2005/0175497 A1* | 8/2005 | Arai | G03F 7/70858 |
| | | | 422/3 |
| 2011/0102754 A1* | 5/2011 | Takagi | G03B 27/42 |
| | | | 355/53 |

FOREIGN PATENT DOCUMENTS

JP    2012109553 A    6/2012
JP     6343326 B2    6/2018

OTHER PUBLICATIONS

Office Action issued in Japanese Appln. No. 2018-096502 dated Mar. 22, 2019.

* cited by examiner

*Primary Examiner* — Hung Nguyen
(74) *Attorney, Agent, or Firm* — Rossi, Kimms & McDowell LLP (57) ABSTRACT

The present invention provides an exposure apparatus that exposes a substrate via a projection optical system, the apparatus including a supply unit including a first channel to which a first gas containing air is supplied, a second channel to which a second gas higher in oxygen concentration than the first gas is supplied, and a third channel to which a third gas lower in oxygen concentration than the first gas is supplied, and configured to generate a mixture gas by using at least two of the first gas, the second gas, and the third gas, and supply the mixture gas to a space between the substrate and the projection optical system.

21 Claims, 5 Drawing Sheets

FIG. 5

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

In the manufacture of a color filter, a semiconductor device, or the like, an exposure apparatus that projects the pattern of an original such as a reticle or a mask on a substrate (a glass plate, a wafer, or the like) via a projection optical system is used to perform a process of forming a pattern (latent image) in a resist on a substrate. It is known that the resist used in such a process becomes slow in chemical reaction by irradiation with exposure light owing to oxygen in an exposure environment. To cope with this, an oxygen concentration in the exposure environment is controlled in response to the need for pattern formation in the resist. For example, the chemical reaction of the resist is slowed down by increasing the oxygen concentration in the exposure environment when a micropattern is formed in the resist at high accuracy, or the chemical reaction of the resist is accelerated by decreasing the oxygen concentration in the exposure environment when throughput is increased.

Japanese Patent Laid-Open No. 2012-109553 discloses an exposure apparatus that generates an atmosphere containing nitrogen more than atmospheric air by mixing nitrogen and oxygen.

Japanese Patent Laid-Open No. 2012-109553 discloses a case in which nitrogen and oxygen are used as two types of gasses different in oxygen concentration. However, using nitrogen and oxygen as the two types of gasses may be disadvantageous in terms of cost.

SUMMARY OF THE INVENTION

The present invention provides an exposure apparatus advantageous in terms of cost to change an oxygen concentration.

According to one aspect of the present invention, there is provided an exposure apparatus that exposes a substrate via a projection optical system, the apparatus including a supply unit including a first channel to which a first gas containing air is supplied, a second channel to which a second gas higher in oxygen concentration than the first gas is supplied, and a third channel to which a third gas lower in oxygen concentration than the first gas is supplied, and configured to generate a mixture gas by using at least two of the first gas, the second gas, and the third gas, and supply the mixture gas to a space between the substrate and the projection optical system.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

First Embodiment

Figure 1:
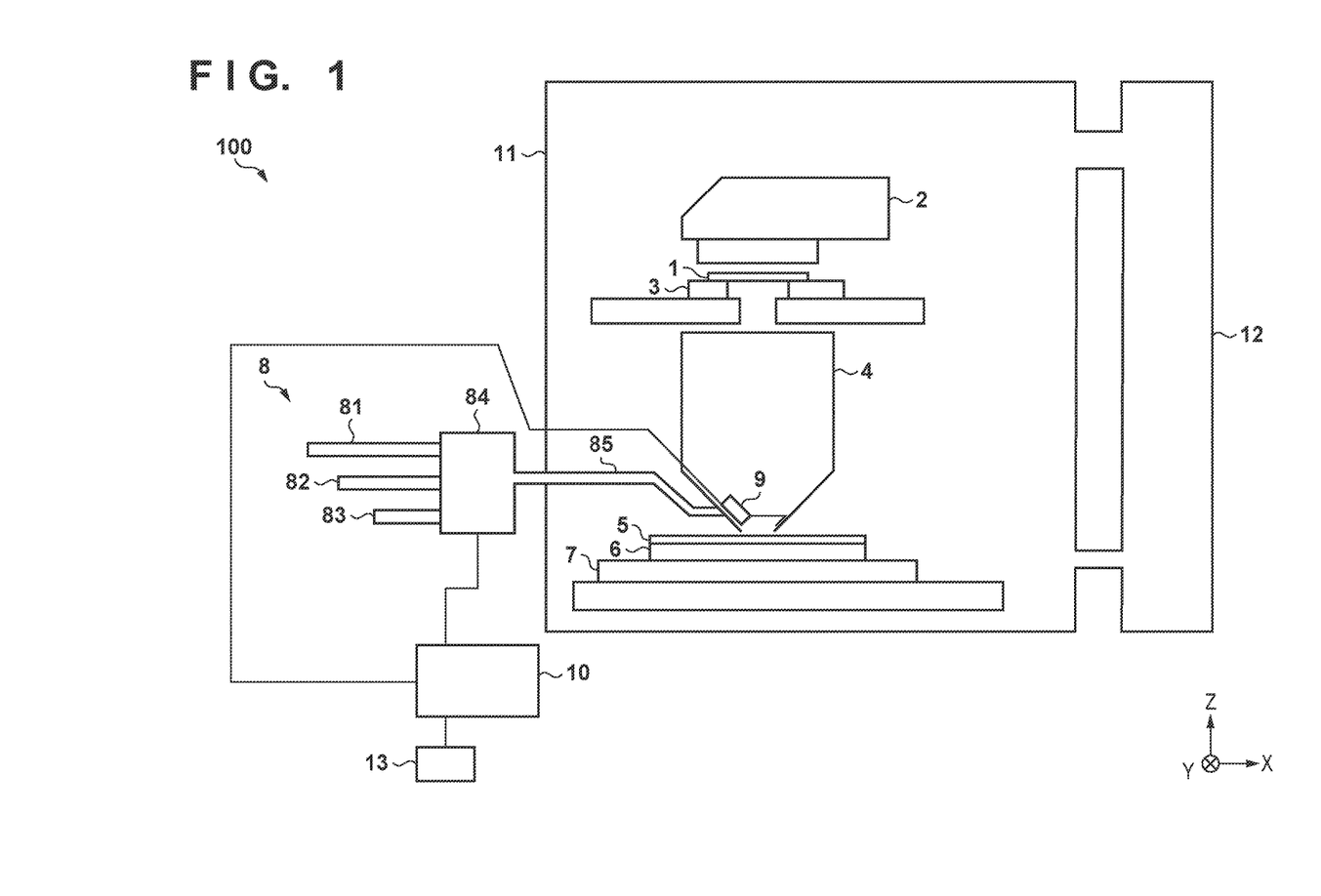
FIG. 1 is a schematic view showing the arrangement of an exposure apparatus according to the first embodiment.

An exposure apparatus 100 of the first embodiment according to the present invention will be described with reference to FIG. 1. FIG. 1 is a schematic view showing the arrangement of the exposure apparatus 100 according to the first embodiment. The exposure apparatus 100 is a lithography apparatus that performs a process (exposure process) of exposing a substrate 6 by a step-and-scan method and transferring the pattern of a mask 1 onto the substrate 6 (a resist 5 on the substrate). However, the exposure apparatus 100 can also use a step-and-repeat method or another exposure method.

The exposure apparatus 100 can include, for example, an illumination optical system 2, a mask stage 3 that can move while holding the mask 1, a projection optical system 4, a substrate stage 7 that can move while holding the substrate 6, a supply unit 8, an oxygen concentration meter 9, and a control unit 10. The control unit 10 is formed by, for example, a computer that includes a CPU, a memory, and the like and controls the respective units of the exposure apparatus 100 (controls the exposure process). The respective units of the exposure apparatus 100 are arranged in a chamber 11 that defines an exposure chamber. An atmosphere in the chamber 11 is maintained at an air atmosphere whose temperature and humidity are controlled by an atmosphere maintaining unit 12.

The illumination optical system 2 shapes light emitted from a light source (not shown) such as a mercury lamp, an ArF excimer laser, or a KrF excimer laser into, for example, band-like or arcuate slit-shaped light and illuminates a portion of the mask 1 with this slit-shaped light. The mask 1 and substrate 6 are respectively held by the mask stage 3 and substrate stage 7, and are arranged in optically almost conjugate positions (the object plane and image plane of the projection optical system 4) via the projection optical system 4. The projection optical system 4 has a predetermined projection magnification, and projects the pattern of the mask 1 onto the substrate 6 (more specifically, the resist 5 supplied (applied) onto the substrate) by using the slit-shaped light. The mask stage 3 and substrate stage 7 are relatively scanned in synchronism with each other at a velocity ratio matching the projection magnification of the projection optical system 4. This makes it possible to transfer the pattern of the mask 1 onto the resist 5 on the substrate.

It is known that in this exposure apparatus 100, the resist 5 becomes slow in chemical reaction by exposure light owing to oxygen in an exposure environment. To cope with this, an oxygen concentration in the exposure environment is controlled in response to the need for pattern formation in the resist 5 on the substrate. For example, the chemical reaction of the resist 5 is slowed down by increasing the oxygen concentration in the exposure environment when a micropattern is formed in the resist 5 at high accuracy, or the chemical reaction of the resist 5 is accelerated by decreasing the oxygen concentration in the exposure environment when throughput is increased.

This will be described by exemplifying a method of manufacturing a color filter. There are available various types of methods of manufacturing the color filter such as a dyeing method, printing method, electrodeposition/electrolysis method, and pigment dispersion method. Among these methods, the pigment dispersion method has been the mainstream nowadays because of its manufacturing stability and simplicity. A photosensitive acrylic method as a typical pigment dispersion method forms a pattern by photolithography on a color resist containing an acryloid-based photosensitive resin and having both a coloring function and a photosensitive function.

A color resist is a negative resist. For this reason, irradiating the resist with exposure light will generate radicals contributing to a reaction and photopolymerize a polymer, thereby making it insoluble to a developer. Note however that the pigment components contained in the color resist easily absorb exposure light, and the generated radicals are trapped in oxygen in the exposure environment (air). This tends to hinder a photopolymerization reaction. That is, the chemical reaction of the color resist by the exposure light becomes slow owing to oxygen in air, decreasing throughput. Therefore, the oxygen concentration in the exposure environment is decreased in order to improve the throughput. On the other hand, a slowdown in chemical reaction of the color resist by the exposure light means that it is possible to control formation of the micropattern in the resist at high accuracy. Therefore, the oxygen concentration in the exposure environment is increased when the micropattern is formed in the resist at high accuracy.

To achieve this, the exposure apparatus 100 of this embodiment includes the supply unit 8 that supplies a gas adjusted at a target oxygen concentration to a space (to be referred to as an "exposure space" hereinafter) between the projection optical system 4 and the substrate 6 and controls the oxygen concentration in the exposure environment.

The supply unit 8 includes a first channel (first pipe) to which the first gas containing air is supplied, a second channel 82 (second pipe) to which the second gas higher in oxygen concentration than the first gas is supplied, and a third channel 83 (third pipe) to which the third gas lower in oxygen concentration than the first gas is supplied. Then, the supply unit 8 generates a gas (mixture gas) at a target oxygen concentration in a chamber 84 to which the first channel 81, second channel 82, and third channel 83 are connected and supplies the generated gas to the exposure space via a channel 85. Generation of the gas at the target oxygen concentration in the supply unit 8 can be performed by causing the control unit 10 to control valves 81a to 83a (for example, massflow meters) provided for the first channel 81, second channel 82, and third channel 83, respectively.

In this embodiment, air, oxygen gas, and nitrogen gas can be used as the first gas, the second gas, and the third gas, respectively. However, the present invention is not limited to this. The first gas is not limited to air and may be a gas whose oxygen concentration is changed from that of the air by mixing nitrogen or oxygen into the air. That is, the first gas means a gas whose principal component is air. For example, a gas (a gas with at least one of the oxygen concentration, temperature, and humidity being adjusted) such as clean dry air generated by plant facilities can be used as the first gas.

The second gas is not limited to oxygen gas as long as its oxygen concentration is high with reference to the first gas, as described above. Similarly, the third gas is not limited to nitrogen gas as long as its oxygen concentration is low with reference to the first gas.

If the oxygen concentration is adjusted by mixing the second gas and the third gas in this supply unit 8, it takes a considerable time until the oxygen concentration of the mixture gas is stabilized because of a large difference in oxygen concentration between the second gas and the third gas. That is, it takes a considerable time until the second gas and the third gas are mixed sufficiently. In this case, unevenness of the oxygen concentration may occur in the exposure space, making it difficult to transfer the pattern of the mask 1 onto the substrate 6 accurately. To cope with this, the supply unit 8 of this embodiment includes the first channel 81 to which the first gas containing air is supplied, and generates a gas at a target oxygen concentration by mixing one of the second gas and third gas into the first gas.

For example, if the target oxygen concentration is higher than the oxygen concentration of the first gas, the supply unit 8 generates the gas at the target oxygen concentration by mixing the second gas into the first gas and supplies the generated gas to the exposure space via the channel 85. On the other hand, if the target oxygen concentration is lower than the oxygen concentration of the first gas, the supply unit 8 generates the gas at the target oxygen concentration by mixing the third gas into the first gas and supplies the generated gas to the exposure space via the channel 85. If the gas at the target oxygen concentration is generated in this manner, a difference in oxygen concentration between the first gas and the second gas or a difference in oxygen concentration between the first gas and the third gas is smaller than the difference in oxygen concentration between the second gas and the third gas, making it possible to shorten a time taken until the oxygen concentration of the mixture gas is stabilized. That is, it is possible to supply the gas having the stabilized oxygen concentration to the exposure space.

Note that in the supply unit 8, the first gas may not be supplied from the first channel 81 due to a failure, for example, a breakdown in plant facilities or the like. In this case, the control unit 10 controls the supply unit 8 (the control valves 81a to 83a of the respective channels) so as to generate the gas at the target oxygen concentration by mixing the second gas and the third gas without using the first gas. The temperature or humidity of the gas at the target oxygen concentration may be adjusted in the chamber 84 based on a result of measuring a temperature or humidity (at least one of the temperature and humidity) in the exposure space. In this case, the exposure apparatus 100 includes a measurement unit that measures the temperature or humidity in the exposure space and an adjustment unit (a heater or the like) that adjusts the temperature or humidity of the gas in the chamber.

The exposure apparatus 100 may further include the oxygen concentration meter 9 (concentration measurement unit) that measures an oxygen concentration in the exposure space. The oxygen concentration meter 9 is placed near the local space (exposure space) between the projection optical system 4 and the substrate 6 to measure the oxygen concentration in the local space. The oxygen concentration meter 9 can also be placed at a position where it can perform alternative measurement of the oxygen concentration between the projection optical system 4 and the substrate 6. For example, placing the oxygen concentration meter 9 between the end portion of the channel 85 of the supply unit 8 and the projection optical system 4 (near its final surface), in the chamber 84 of the supply unit 8, or the like can perform alternative measurement. By thus providing the oxygen concentration meter 9, the control unit 10 can control, based on the measurement result of the oxygen concentration meter 9, the control valves 81a to 83a provided for the first channel 81, the second channel 82, and third channel 83, respectively, and generate the gas at the target oxygen concentration.

Example 1

An example will be described below in which a supply unit 8 generates a gas at a target oxygen concentration and supplies it to an exposure space.

A control unit 10 obtains, from a storage unit 13, an exposure recipe used for an exposure process and loads a set target oxygen concentration in the exposure space into the obtained exposure recipe. Then, the control unit 10 controls the supply unit 8 to generate the gas at the target oxygen concentration and supply it to the exposure space. At this time, the control unit 10 may control, based on an oxygen concentration in the exposure space measured by an oxygen concentration meter 9, the supply unit 8 such that the target oxygen concentration is obtained in the exposure space. In this embodiment (FIG. 1), the storage unit 13 and the control unit 10 are formed separately. However, the storage unit 13 may be formed as a part of the control unit 10.

Figure 2A:
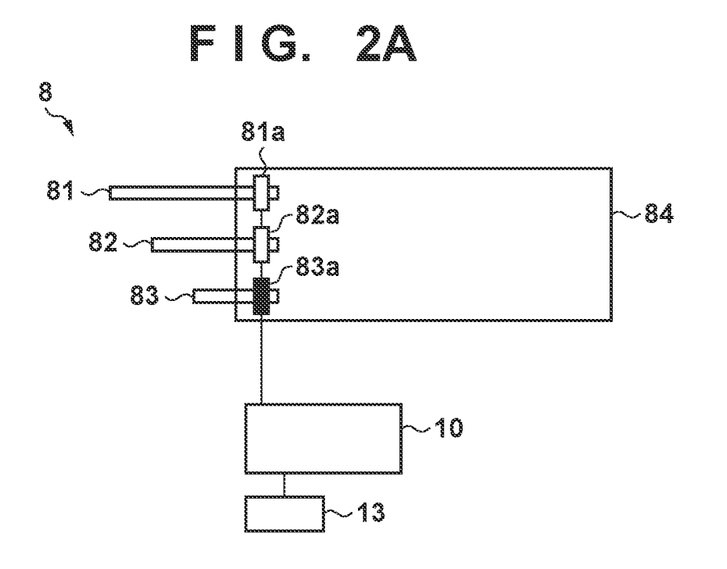
FIGS. 2A and 2B are views each showing the arrangement of a supply unit.

Assume that, for example, the oxygen concentration of the first gas (air) is 21%, the oxygen concentration of the second gas (oxygen) is 99%, and the oxygen concentration of the third gas (nitrogen) is 1%, and the internal capacity of a chamber 84 is 10 L. If the target oxygen concentration is higher than the oxygen concentration of the first gas, the control unit 10 controls control valves 81a and 82a of a first channel 81 and second channel 82, and generates a gas at a target oxygen concentration by mixing the first gas and the second gas in the chamber 84, as shown in FIG. 2A. At this time, a control valve 83a of a third channel 83 is closed. As an example, when a gas having a target oxygen concentration of 30% which is higher than the oxygen concentration of the first gas is generated, the control unit 10 controls the control valves 81a and 82a of the first channel 81 and second channel 82 such that the 8.85-L first gas and the 1.15-L second gas are supplied into the chamber 84.

Figure 2B:
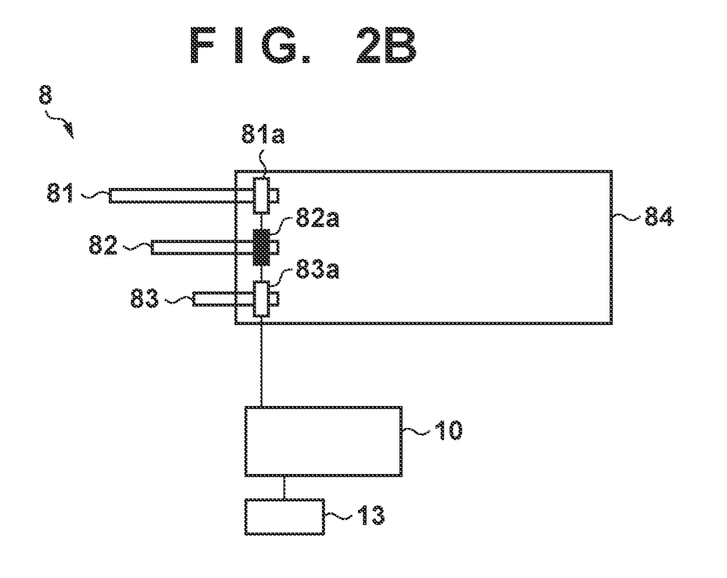

On the other hand, if the target oxygen concentration is lower than the oxygen concentration of the first gas, the control unit 10 controls the control valves 81a and 83a of the first channel 81 and third channel 83, and generates a gas at a target oxygen concentration by mixing the first gas and the third gas in the chamber 84, as shown in FIG. 2B. At this time, the control valve 82a of the second channel 82 is closed. As an example, when a gas having a target oxygen concentration of 10% which is lower than the oxygen concentration of the first gas is generated, the control unit 10 controls the control valves 81a and 83a of the first channel 81 and third channel 83 such that the 4.5-L first gas and the 5.5-L third gas are supplied into the chamber 84.

By thus generating the gas at the target oxygen concentration with reference to the first gas, it is possible to further shorten a time taken until the oxygen concentration of the mixture gas is stabilized than by generating a gas at a target oxygen concentration by mixing the second gas and the third gas with a large difference in oxygen concentration. In general, air is less expensive than oxygen gas and nitrogen gas. Thus, it can be more advantageous in terms of cost to generate a gas at a target oxygen concentration with reference to air than to generate a gas at a target oxygen concentration by mixing oxygen gas and nitrogen gas.

Example 2

In Example 1, the air (oxygen concentration of 21%) is used as the first gas. In Example 2, however, an example will be described in which a gas having an oxygen concentration different from that of air is used as the first gas. In Example 2, assume that the oxygen concentration of the first gas is 50%, the oxygen concentration of the second gas (oxygen gas) is 99%, and the oxygen concentration of the third gas (nitrogen gas) is 1%, and the internal capacity of a chamber 84 is 10 L.

For example, when a gas having a target oxygen concentration of 60% which is higher than the oxygen concentration of the first gas is generated, a control unit 10 controls control valves 81a and 82a of a first channel 81 and second channel 82 such that the 7.95-L first gas and the 2.05-L second gas are supplied into the chamber 84. On the other hand, when a gas having a target oxygen concentration of 40% which is lower than the oxygen concentration of the first gas is generated, the control unit 10 controls the control valves 81a and a control valve 83a of the first channel 81 and a third channel 83 such that the 7.95-L first gas and the 2.05-L third gas are supplied into the chamber 84.

Second Embodiment

An exposure apparatus of the second embodiment according to the present invention will be described. The arrangement of the exposure apparatus of this embodiment is the same as in the first embodiment.

In the exposure apparatus, in general, the optical performance of a projection optical system 4 is largely influenced by a refractive index in a local space (exposure space) between a substrate 6 and the projection optical system 4 (final surface). The refractive index of a gas changes due to the temperature and humidity of the gas. It is therefore possible, by making the change in temperature and humidity of the gas small, to perform an exposure process while setting the optical performance of the projection optical system 4 in a desired state.

Figure 3A:
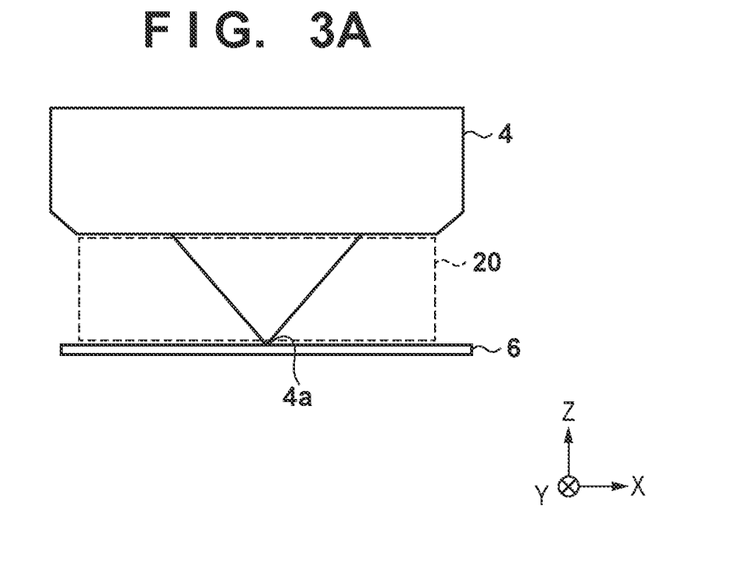
FIGS. 3A and 3B are views each for explaining the imaging position of a projection optical system.
Figure 3B:
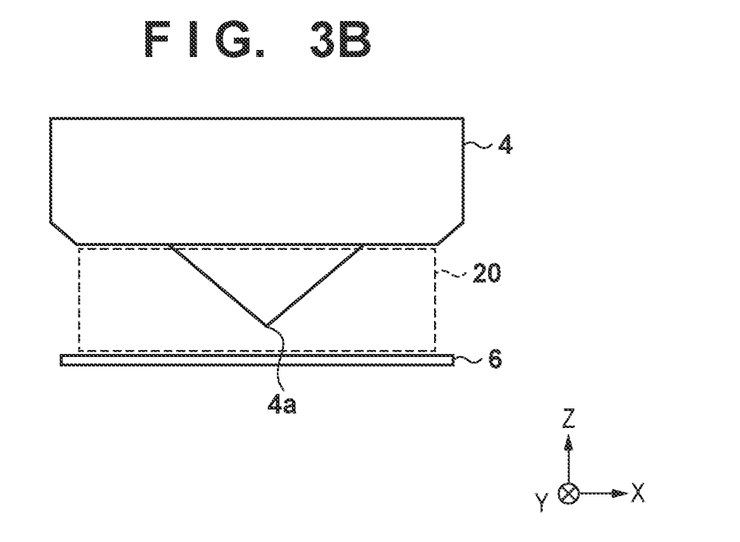

For example, FIG. 3A is a view showing an imaging position 4a of the projection optical system 4 in a case in which a supply unit 8 supplies a gas at a target oxygen concentration to an exposure space 20. In an exposure apparatus 100, the exposure process is performed in a state in which the surface position (Z direction) of the substrate 6 matches the imaging position 4a of the projection optical system 4 as shown in FIG. 3A. On the other hand, FIG. 3B is a view showing the imaging position 4a of the projection optical system 4 in a case in which, as compared with the state of FIG. 3A, the oxygen concentration of the gas supplied to the exposure space 20 by the supply unit 8 is the same, but the temperature and humidity of the gas are different. If the temperature and humidity of the gas supplied to the exposure space 20 are different from those in the state of FIG. 3A, the refractive index in the exposure space 20 changes, resulting in changing the imaging position 4a of the projection optical system 4. Consequently, the surface position of the substrate 6 may shift from the imaging position 4a of the projection optical system 4, as shown in FIG. 3B.

To cope with this, in the exposure apparatus of this embodiment, the first gas, the second gas, and the third gas are adjusted at different temperatures in advance, and these gasses are mixed such that a mixture gas approaches its target oxygen concentration and target temperature. That is, the temperature of the mixture gas is adjusted by mixing at least two of the first gas, the second gas, and the third gas. The target temperature can include, for example, the temperature of an atmosphere (the temperature of the internal atmosphere of a chamber 11) where the projection optical system 4 is arranged. In this embodiment, an example will be described in which the first gas, the second gas, and the third gas are adjusted at the different temperatures in advance. However, the present invention is not limited to this, and these gasses may be adjusted at different humidities in advance. In this case, these gasses are mixed such that the mixture gas has a target humidity.

Assume that, for example, the oxygen concentration of the first gas (air) is 21%, the oxygen concentration of the second gas (oxygen gas) is 99%, and the oxygen concentration of the third gas (nitrogen gas) is 1%, and the internal capacity of a chamber 84 is 10 L. Then, assume a case in which the temperature of the first gas is adjusted at 20° C., the temperature of the second gas is adjusted at 25° C., and the temperature of the third gas is adjusted at 15° C. in advance, and a gas having a target oxygen concentration of 30% is generated. As one method of generating the gas having the target oxygen concentration of 30%, there is a method of mixing the 8.85-L first gas and the 1.15-L second gas. The method can set the temperature of the mixture gas at 20.6° C. As another method of generating a gas having a target oxygen concentration of 30%, there is a method of mixing the 2.96-L second gas and the 7.04-L third gas. The method can set the temperature of the mixture gas at 18° C. As still another method of generating the gas having the target oxygen concentration of 30%, there is a method of mixing the 5-L first gas, the 1.94-L second gas, and the 3.06-L third gas. The method can set the temperature of the mixture gas at 19.4° C. It is possible to generate a gas having a desired oxygen concentration and a desired temperature by thus changing the mixing ratio of the first gas, second gas, and third gas set at the different temperatures.

Third Embodiment

Figure 4:
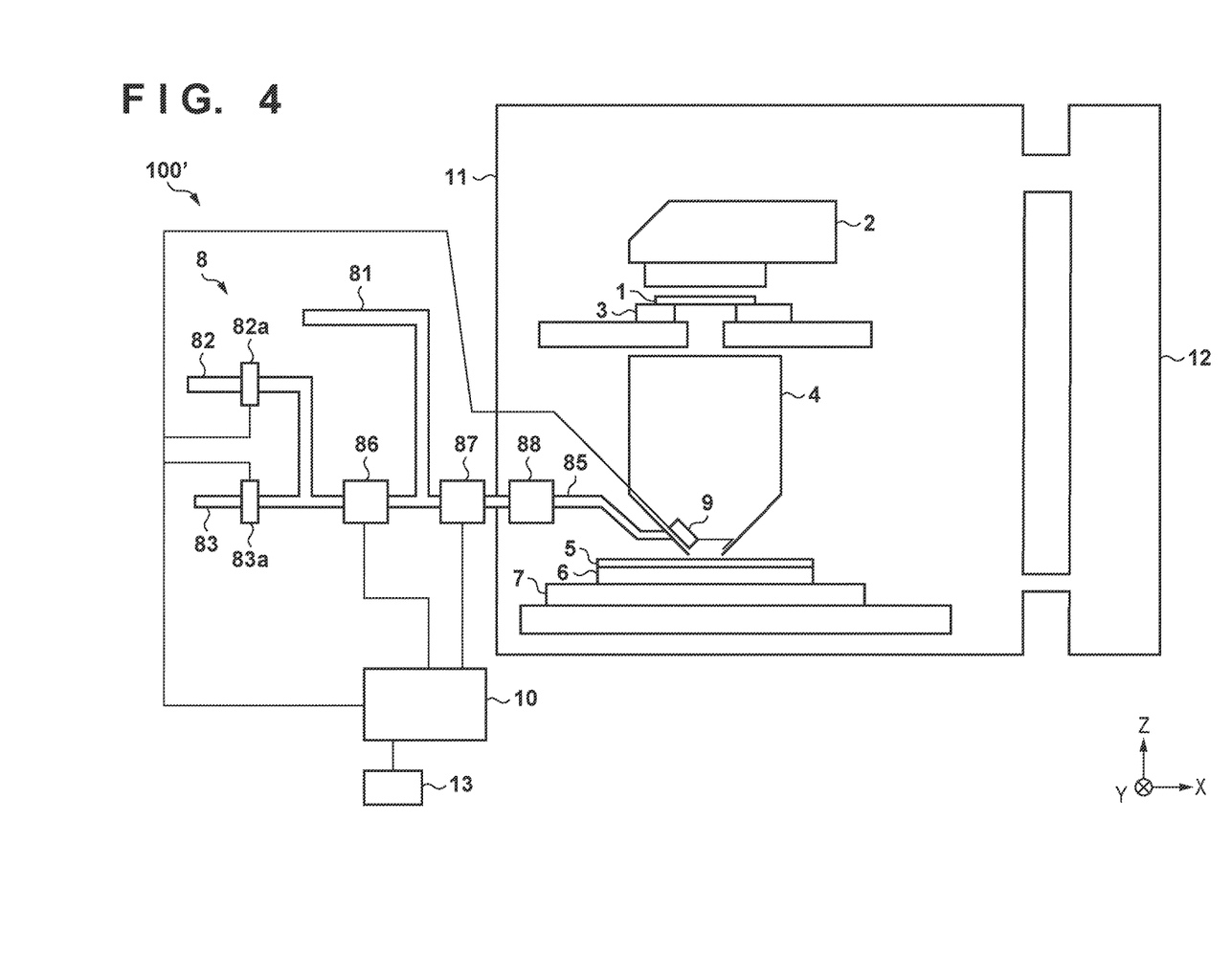
FIG. 4 is a schematic view showing the arrangement of an exposure apparatus according to the third embodiment.

An exposure apparatus 100' of the third embodiment according to the present invention will be described with reference to FIG. 4. FIG. 4 is a schematic view showing the arrangement of the exposure apparatus 100' according to the third embodiment. The exposure apparatus 100' of the third embodiment is different from the exposure apparatus 100 of the first embodiment in arrangement of a supply unit 8, and a first channel 81 is connected downstream of a portion to which a second channel 82 and a third channel 83 are connected. That is, to one of the second channel 82 and third channel 83, the first channel 81 and the other of the second channel 82 and third channel 83 are sequentially connected. Note that the connection arrangement of the first channel 81, second channel 82, and third channel 83 is not limited to the arrangement shown in FIG. 4, and an arrangement can be adopted in which, to one of the first channel 81, second channel 82, and third channel 83, the other two channels are sequentially connected. The exposure apparatus 100' is the same as the exposure apparatus 100 of the first embodiment except for the arrangement of the supply unit 8.

The supply unit 8 of the third embodiment includes the first channel 81 to which the first gas containing air is supplied, the second channel 82 to which the second gas higher in oxygen concentration than the first gas is supplied, and the third channel 83 to which the third gas lower in oxygen concentration than the first gas is supplied. The second channel 82 and the third channel 83 include control valves 82a and 83a, respectively. The supply unit 8 can also include a first adjustment unit 86, a second adjustment unit 87, and a temperature adjustment unit 88. The first adjustment unit 86 is arranged downstream of the portion to which the second channel 82 and the third channel 83 are connected, and adjusts the flow rate (flow velocity) of the second gas supplied from the second channel 82 or the third gas supplied from the third channel 83. The second adjustment unit 87 is arranged downstream of a portion to which the first channel 81 is connected, and adjusts the flow rate (flow velocity) of a mixture gas of the first gas and the gas (the second gas or the third gas) supplied from the first adjustment unit 86. Those of the first adjustment unit 86 and second adjustment unit 87 generate a gas at a target oxygen concentration. Each of the first adjustment unit 86 and the second adjustment unit 87 can be formed by, for example, a massflow meter or the like.

Figure 5:
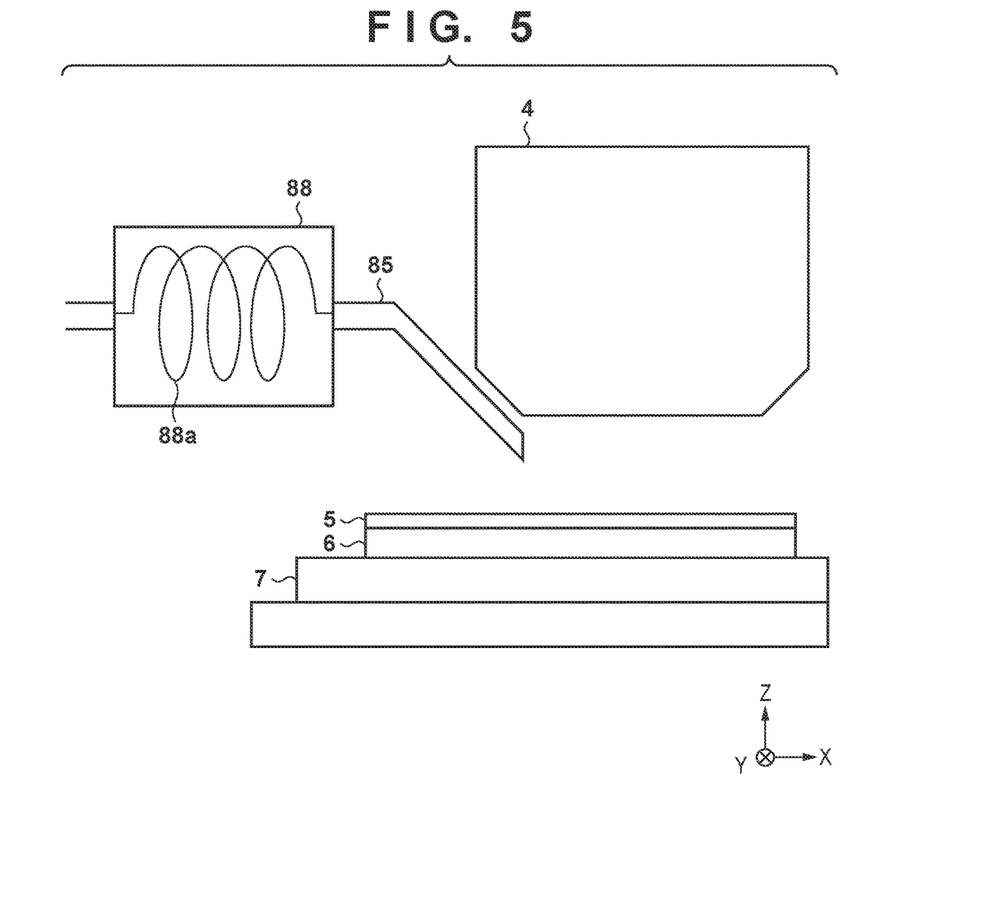
FIG. 5 is a view showing the arrangement of a temperature adjustment unit.

The temperature adjustment unit 88 is arranged in (in an atmosphere where a projection optical system 4 is arranged) a chamber 11 that defines an exposure chamber and adjusts the temperature of the gas supplied from the second adjustment unit 87 to the temperature of the internal atmosphere of the chamber 11. The temperature adjustment unit 88 includes, for example, a fourth channel 88a (pipe) through which the mixture gas (the gas at the target oxygen concentration) supplied from the second adjustment unit 87 passes, and the outer surface of the fourth channel 88a is exposed to the internal atmosphere of the chamber 11. Therefore, the temperature adjustment unit 88 can adjust (match) the mixture gas supplied from the second adjustment unit 87 at the internal temperature of the chamber 11 by passing the mixture gas through the fourth channel 88a. By thus arranging the supply unit 8, it is possible to supply, to an exposure space, a gas at a target oxygen concentration having a small temperature difference relative to the exposure space. Note that in order to adjust the mixture gas efficiently at the internal temperature of the chamber 11 in the temperature adjustment unit 88, the fourth channel 88a is preferably formed into, for example, a helical shape as shown in FIG. 5. The temperature adjustment unit 88 is not limited to this embodiment, and is also applicable to the first embodiment and the second embodiment.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern (latent image) on a substrate (a photoresist applied thereto) using the above-described exposure apparatus (a step of exposing the substrate) and a step of developing the substrate exposed (on which the pattern has been formed) in the preceding step. This manufacturing method can further include other known steps (oxidation, deposition, vapor deposition, doping, planarization, etching, resist removal, dicing, bonding, packaging, and the like). The method of manufacturing the article according to this embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2016-225374 filed on Nov. 18, 2016 which is hereby incorporated by reference herein in its entirety.

What is claimed is:

1. An exposure apparatus that exposes a substrate via a projection optical system, the apparatus comprising:
   a supply unit configured to supply gas to adjust oxygen concentration in a space onto the substrate,
   wherein the exposure apparatus is configured to expose a substrate in a state where the oxygen concentration in the space is adjusted to a first oxygen concentration higher than oxygen concentration of air, and configured to expose a substrate in a state where the oxygen concentration in the space is adjusted to a second oxygen concentration lower than oxygen concentration of air, and
   wherein the supply unit:
      supplies, to the space, air and a second gas higher in oxygen concentration than the air when oxygen concentration in the space is adjusted to the first oxygen concentration, and
      supplies, to the space, air and a third gas lower in oxygen concentration than the air oxygen concentration in the space is adjusted to the second oxygen concentration.

2. An exposure apparatus that exposes a substrate via a projection optical system, the apparatus comprising:
   a supply unit including a first channel to which a first gas containing air is supplied, a second channel to which a second gas higher in oxygen concentration than the first gas is supplied, a third channel to which a third gas lower in oxygen concentration than the first gas is supplied, and an adjustment unit configured to adjust a temperature of a mixture gas,
   wherein the supply unit is configured to generate the mixture gas including at least two of the first gas supplied from the first channel, the second gas supplied from the second channel, and the third gas supplied from the third channel, and supply the mixture gas to a space between the substrate and the projection optical system, and
   wherein the adjustment unit includes a fourth channel which is provided in an atmosphere where the projection optical system is arranged and through which the mixture gas passes.

3. The apparatus according to claim 2, wherein the fourth channel is formed into a helical shape.

4. An exposure apparatus that exposes a substrate via a projection optical system, the apparatus comprising:
   a supply unit including a first channel to which a first gas containing air is supplied, a second channel to which a second gas higher in oxygen concentration than the first gas is supplied, and a third channel to which a third gas lower in oxygen concentration than the first gas is supplied, and
   wherein the supply unit is configured to generate a mixture gas including at least two of the first gas supplied from the first channel, the second gas supplied from the second channel, and the third gas supplied from the third channel, and supply the mixture gas to a space between the substrate and the projection optical system,
   wherein the first gas, the second gas, and the third gas are adjusted at different temperatures, and
   wherein the supply unit adjusts a temperature of the mixture gas by mixing at least two of the first gas, the second gas, and the third gas.

5. A method of manufacturing an article, the method comprising:
   exposing a substrate by using an exposure apparatus;
   developing the substrate exposed in the exposing; and
   manufacturing the article from the developed substrate,
   wherein the exposure apparatus exposes the substrate and includes:
      a supply unit configured to supply a gas to adjust oxygen concentration in a space onto the substrate
      wherein the exposure apparatus is configured to expose a substrate in a state where the oxygen concentration in the space is adjusted to a first oxygen concentration higher than oxygen concentration of air, and configured to expose a substrate in a state where the oxygen concentration in the space is adjusted to a second oxygen concentration lower than oxygen concentration of air, and
      wherein the supply unit:
         supplies, to the space, air and second gas higher in oxygen concentration than the air when oxygen concentration in the space is adjusted to the first oxygen concentration; and
         supplies, to the space, air and a third gas lower in oxygen concentration than the air when oxygen concentration in the space is adjusted to the second oxygen concentration.

6. The apparatus according to claim 1, further comprising a control unit,
   wherein the control unit configured to set a target oxygen concentration in the space to the first oxygen concentration and the second oxygen concentration,
   wherein the control unit sets the target oxygen concentration to the first oxygen concentration and adjusts oxygen concentration in the space to the first oxygen concentration, and
   wherein the control unit sets the target oxygen concentration to the second oxygen concentration and adjusts oxygen concentration in the space to the second oxygen concentration.

7. A method of manufacturing an article, the method comprising:
   exposing a substrate by using an exposure apparatus;
   developing the substrate exposed in the exposing; and
   manufacturing the article from the developed substrate,
   wherein the exposure apparatus exposes the substrate via a projection optical system, and includes:
      a supply unit including a first channel to which a first gas containing air is supplied, a second channel to which a second gas higher in oxygen concentration than the first gas is supplied, a third channel to which a third gas lower in oxygen concentration than the first gas is supplied, and an adjustment unit configured to adjust a temperature of a mixture gas,
      wherein the supply unit is configured to generate the mixture gas including at least two of the first gas supplied from the first channel, the second gas supplied from the second channel, and the third gas supplied from the third channel, and supply the mixture gas to a space between the substrate and the projection optical system, and
      wherein the adjustment unit includes a fourth channel which is provided in an atmosphere where the projection optical system is arranged and through which the mixture gas passes.

8. A method of manufacturing an article, the method comprising:
   exposing a substrate by using an exposure apparatus;

developing the substrate exposed in the exposing; and manufacturing the article from the developed substrate, wherein the exposure apparatus exposes the substrate via a projection optical system, and includes a supply unit including a first channel to which a first gas containing air is supplied, a second channel to which a second gas higher in oxygen concentration than the first gas is supplied, and a third channel to which a third gas lower in oxygen concentration than the first gas is supplied, wherein the supply unit is configured to generate a mixture gas including at least two of the first gas supplied from the first channel, the second gas supplied from the second channel, and the third gas supplied from the third channel, and supply the mixture gas to a space between the substrate and the projection optical system, wherein the first gas, the second gas, and the third gas are adjusted at different temperatures, and wherein the supply unit is configured to adjust a temperature of the mixture gas by mixing at least two of the first gas, the second gas, and the third gas.

9. The apparatus according to claim 1, wherein the supply unit includes a first channel to which a first gas containing air is supplied, a second channel to which the second gas higher in oxygen concentration than the first gas is supplied, and a third channel to which the third gas lower in oxygen concentration than the first gas is supplied; and wherein the supply unit
supplies, to the space, the first gas from the first channel and the second gas from the second channel when oxygen concentration in the space is adjusted to the first oxygen concentration, and
supplies, to the space, the first gas from the first channel and the third gas from the third channel when oxygen concentration in the space is adjusted to the second oxygen concentration.

10. The apparatus according to claim 9, wherein the supply unit supplies, to the space, the first gas from the first channel and the second gas from the second channel by closing the third channel when oxygen concentration in the space is adjusted to the first oxygen concentration, and supplies, to the space, the first gas from the first channel and the third gas from the third channel by closing the second channel when oxygen concentration in the space is adjusted to the second oxygen concentration.

11. The apparatus according to claim 10,
wherein the supply unit includes control valves provided for the second channel and the third channel, respectively, and
wherein the control valve provided for the third channel is closed when oxygen concentration in the space is adjusted to the first oxygen concentration, and the control valve provided for the second channel is closed when oxygen concentration in the space is adjusted to the second oxygen concentration.

12. The apparatus according to claim 9, wherein the supply unit
supplies the mixture gas obtained by mixing the first gas and the second gas to the space when oxygen concentration in the space is adjusted to the first oxygen concentration; and
supplies the mixture gas obtained by mixing the first gas and the third gas to the space when oxygen concentration in the space is adjusted to the second oxygen concentration.

13. The apparatus according to claim 12, wherein the supply unit includes a chamber to which the first channel and the second channel are connected and the mixture gas including the first gas and the second gas is generated in the chamber.

14. The apparatus according to claim 12, wherein the supply unit includes a chamber to which the first channel and the third channel are connected and the mixture gas including the first gas and the third gas is generated in the chamber.

15. The apparatus according to claim 12, wherein in the supply unit, after one of the second channel and the third channel is connected to the other of the second channel and the third channel, the first channel is connected, and the mixture gas is generated.

16. The apparatus according to claim 12, wherein in the supply unit, to one of the first channel, the second channel and the third channel, the other two channels are sequentially connected, and the mixture gas is generated.

17. The apparatus according to claim 12, wherein the supply unit includes an adjustment unit configured to adjust a temperature of the mixture gas.

18. The apparatus according to claim 17, wherein the adjustment unit includes a fourth channel which is provided in an atmosphere where a substrate stage is arranged and through which the mixture gas passes.

19. The apparatus according to claim 18, wherein the fourth channel is formed into a helical shape.

20. The apparatus according to claim 12,
wherein the first gas, the second gas, and the third gas are adjusted at different temperatures, and
wherein the supply unit is configured to adjust a temperature of the mixture gas by mixing at least two of the first gas, the second gas and the third gas.

21. The apparatus according to claim 9, wherein the first gas is air.

* * * * *